(12) United States Patent
Chen

(10) Patent No.: US 10,756,053 B1
(45) Date of Patent: Aug. 25, 2020

(54) METHOD OF TRANSFERRING MICRO DEVICES AND DEVICE TRANSFER ASSEMBLY

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

(*) Notice: Subject to any disclaimer, the term of this patent is extended or adjusted under 35 U.S.C. 154(b) by 0 days.

(21) Appl. No.: 16/507,056

(22) Filed: Jul. 10, 2019

(51) Int. Cl.
*H01L 23/00* (2006.01)
*H01L 21/67* (2006.01)

(52) U.S. Cl.
CPC ........ *H01L 24/97* (2013.01); *H01L 21/67144* (2013.01); *H01L 24/83* (2013.01); *H01L 2221/68322* (2013.01)

(58) Field of Classification Search
CPC ... H01L 24/97; H01L 24/83; H01L 21/67144; H01L 2221/68322
See application file for complete search history.

(56) References Cited

U.S. PATENT DOCUMENTS

2018/0151804 A1* 5/2018 Chaji .................... H01L 27/326
* cited by examiner

*Primary Examiner* — Matthew L Reames
(74) *Attorney, Agent, or Firm* — CKC & Partners Co., LLC

(57) ABSTRACT

A method of transferring micro devices includes: aligning a detachable transfer plate to a carrier substrate with micro devices thereon by an alignment assistive mechanism which is detachably assembled with the detachable transfer plate; contacting the detachable transfer plate to the micro devices on the carrier substrate by the alignment assistive mechanism; picking up the micro devices from the carrier substrate; detaching the detachable transfer plate with the micro devices thereon from the alignment assistive mechanism; moving the detachable transfer plate with the micro devices thereon to be assembled to another alignment assistive mechanism above a receiving substrate to form a device transfer assembly; aligning the micro devices on the detachable transfer plate with the receiving substrate; and transferring the micro devices to the receiving substrate by the another alignment assistive mechanism through the detachable transfer plate.

14 Claims, 19 Drawing Sheets

100

- aligning a detachable transfer plate to a carrier substrate with micro devices thereon by an alignment assistive mechanism which is detachably assembled with the detachable transfer plate — 110
- contacting the detachable transfer plate to the micro devices on the carrier substrate by the alignment assistive mechanism — 120
- picking up the micro devices from the carrier substrate by the detachable transfer plate — 130
- detaching the detachable transfer plate with the micro devices thereon from the alignment assistive mechanism — 140
- moving the detachable transfer plate with the micro devices thereon to be assembled to another alignment assistive mechanism above a receiving substrate to form a device transfer assembly in which the micro devices face the receiving substrate — 150
- aligning the micro devices on the detachable transfer plate with the receiving substrate — 160
- transferring the micro devices to the receiving substrate by the another alignment assistive mechanism through the detachable transfer plate — 170

METHOD OF TRANSFERRING MICRO DEVICES AND DEVICE TRANSFER ASSEMBLY

BACKGROUND

Field of Invention

The present disclosure relates to a method of transferring micro devices and a device transfer assembly.

Description of Related Art

The statements in this section merely provide background information related to the present disclosure and do not necessarily constitute prior art.

Traditional technologies for transferring of devices include transferring from a transfer wafer to a receiving substrate by wafer bonding. One such implementation is "direct bonding" involving one bonding stage of an array of devices from a transfer wafer to a receiving substrate, followed by removal of the transfer wafer. Another such implementation is "indirect bonding" which involves two bonding/de-bonding stages. In indirect bonding, a transfer head may pick up an array of devices from a donor substrate, and then bond the array of devices to a receiving substrate, followed by removal of the transfer head.

In recent years, many researchers and experts try to overcome difficulties in making a massive transfer of devices (i.e., transferring millions or tens of millions of devices) possible for commercial applications. Among those difficulties, cost reduction, time efficiency, and yield are three of the important issues.

SUMMARY

According to some embodiments of the present disclosure, a method of transferring micro devices is provided. The method includes: aligning a detachable transfer plate to a carrier substrate with micro devices thereon by an alignment assistive mechanism which is detachably assembled with the detachable transfer plate; contacting the detachable transfer plate to the micro devices on the carrier substrate by the alignment assistive mechanism; picking up the micro devices from the carrier substrate by the detachable transfer plate; detaching the detachable transfer plate with the micro devices thereon from the alignment assistive mechanism; moving the detachable transfer plate with the micro devices thereon to be assembled to another alignment assistive mechanism above a receiving substrate to form a device transfer assembly, in which the micro devices face the receiving substrate; aligning the micro devices on the detachable transfer plate with the receiving substrate; and transferring the micro devices to the receiving substrate by the another alignment assistive mechanism through the detachable transfer plate.

According to some embodiments of the present disclosure, a device transfer assembly is provided. The device transfer assembly includes an alignment assistive mechanism and a detachable transfer plate. The alignment assistive mechanism has a first portion fixed at a place and a second portion which is movable at least in one axis. The detachable transfer plate is detachably assembled on the second portion of the alignment assistive mechanism. The detachable transfer plate is configured to pick up a micro device from a carrier substrate or to place the micro device to a receiving substrate. The detachable transfer plate includes at least one recess thereon, and the at least one recess is configured to accommodate another micro device on the carrier substrate not to be picked up.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
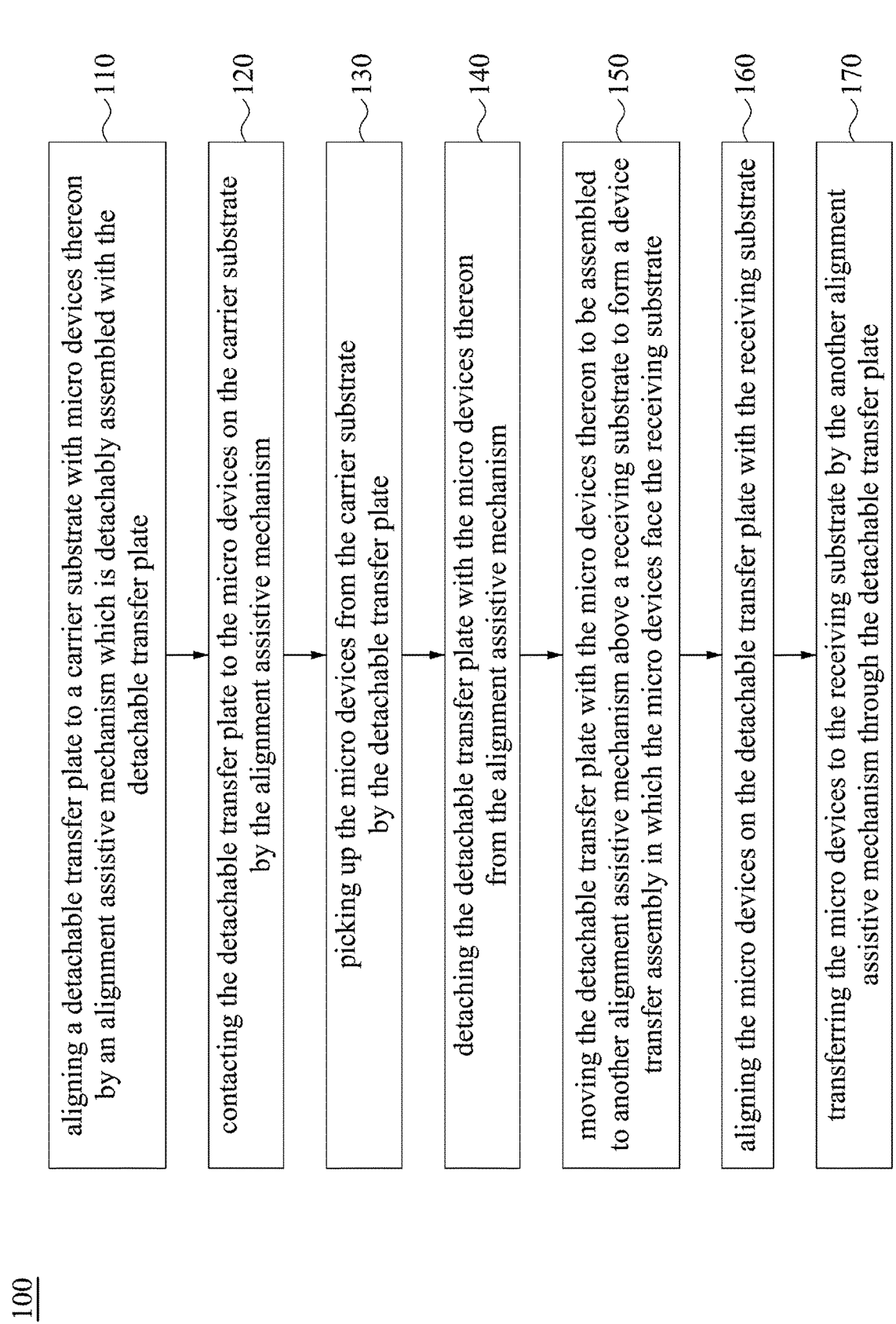
FIG. 1 is a schematic flow chart of a method of transferring micro devices according to some embodiments of the present disclosure.

Reference will now be made in detail to the present embodiments of the disclosure, examples of which are illustrated in the accompanying drawings.

Wherever possible, the same reference numbers are used in the drawings and the description to refer to the same or like parts.

In various embodiments, the description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment" or the like means that a particular feature, structure, configuration, or characteristic described in connection with the embodiment is included in at least one embodiment of the disclosure. Thus, the appearances of the phrase "in one embodiment," "in an embodiment" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Figure 2A:
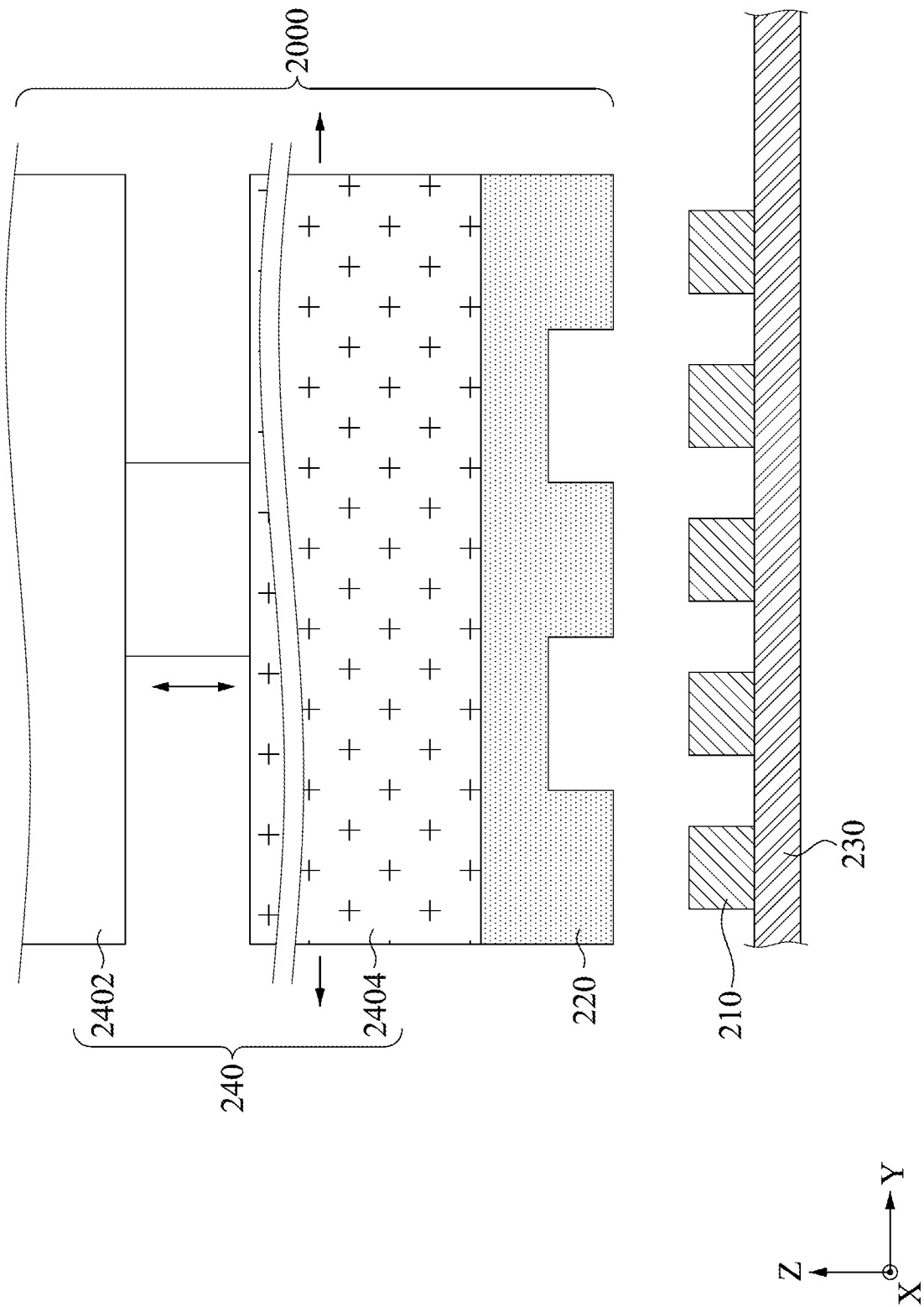
FIG. 2A is a schematic cross-sectional view of an intermediate stage of the method of transferring the micro devices according to some embodiments of the present disclosure.
Figure 2B:
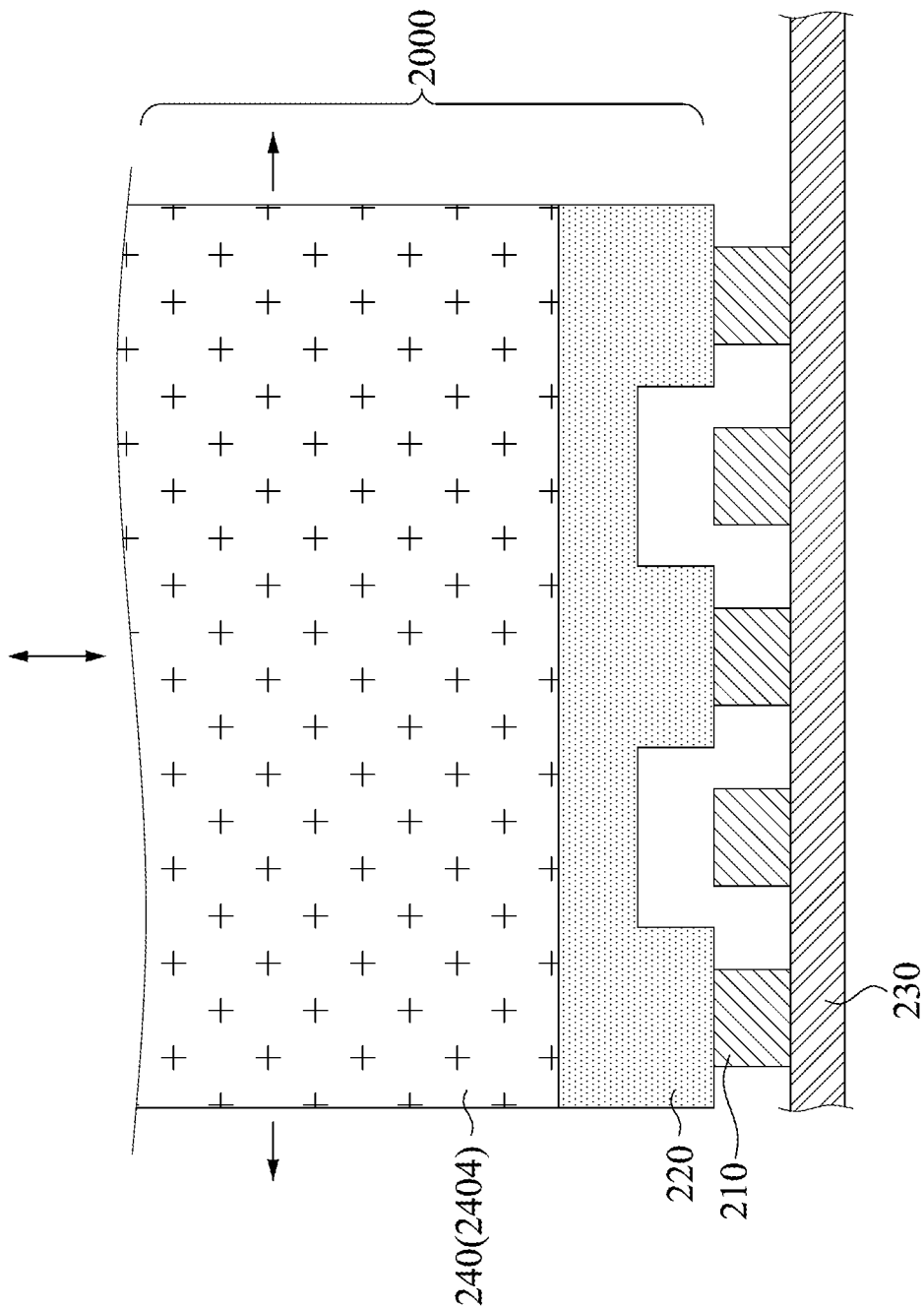
FIG. 2B is a schematic cross-sectional view of an intermediate stage of the method of transferring the micro devices according to some embodiments of the present disclosure.
Figure 2C:
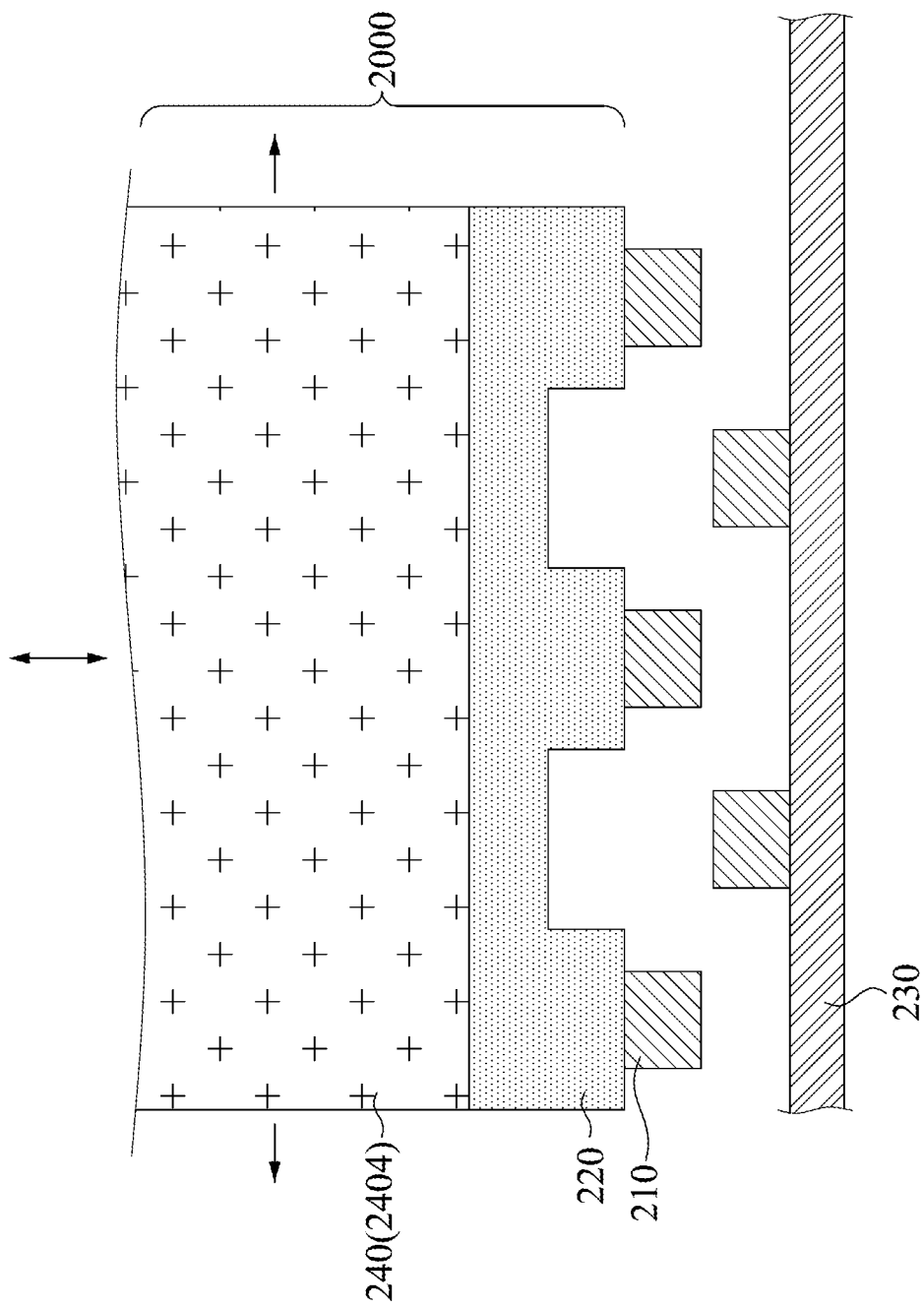
FIG. 2C is a schematic cross-sectional view of an intermediate stage of the method of transferring the micro devices according to some embodiments of the present disclosure.
Figure 2D:
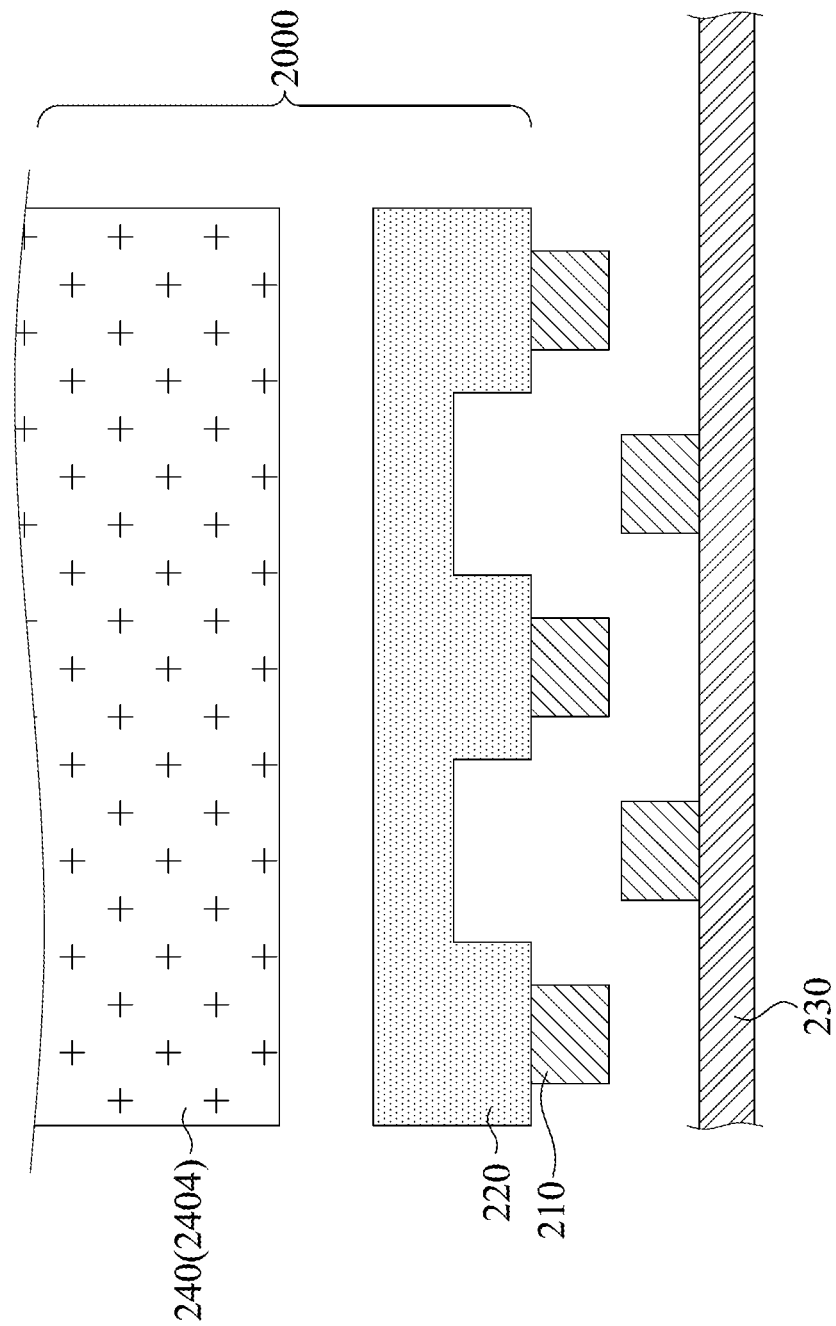
FIG. 2D is a schematic cross-sectional view of an intermediate stage of the method of transferring the micro devices according to some embodiments of the present disclosure.
Figure 2E:
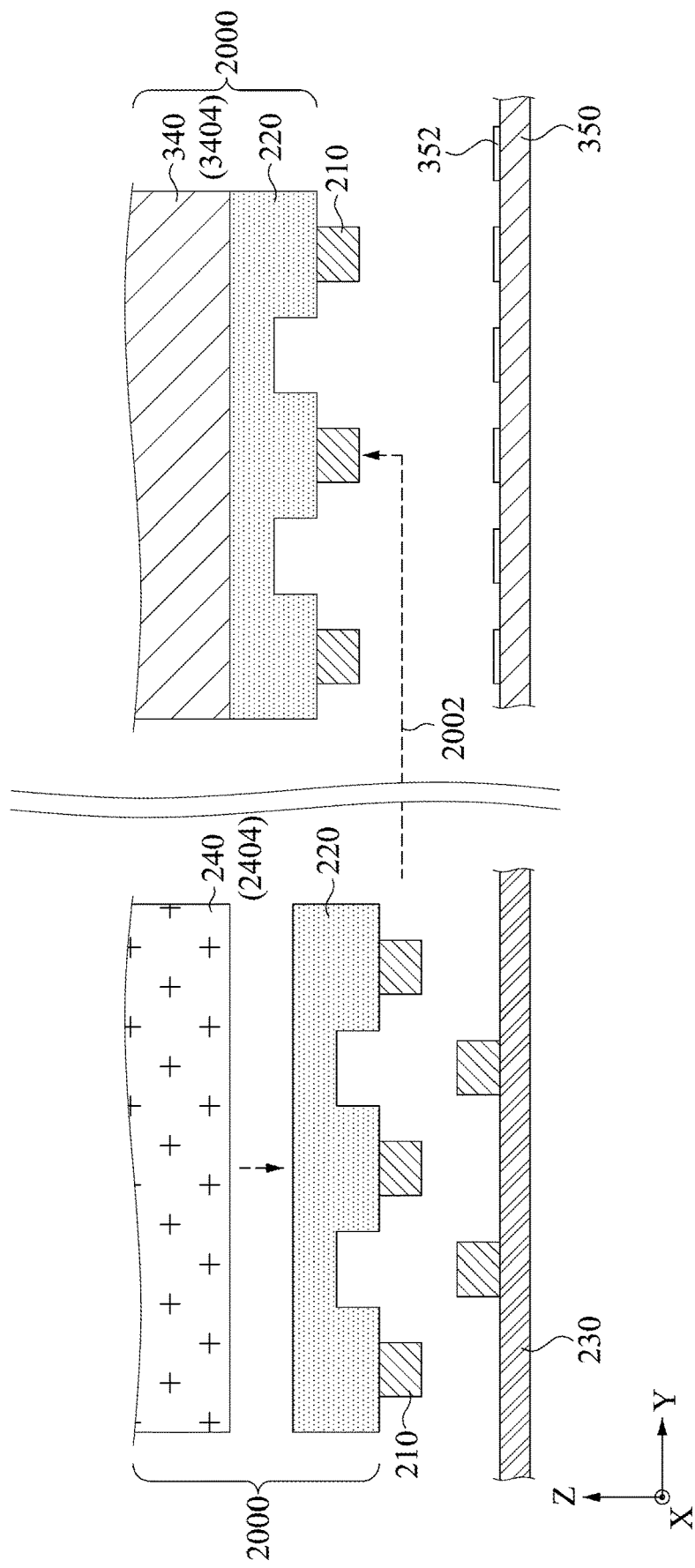
FIG. 2E is a schematic cross-sectional view of an intermediate stage of the method of transferring the micro devices according to some embodiments of the present disclosure.
Figure 2F:
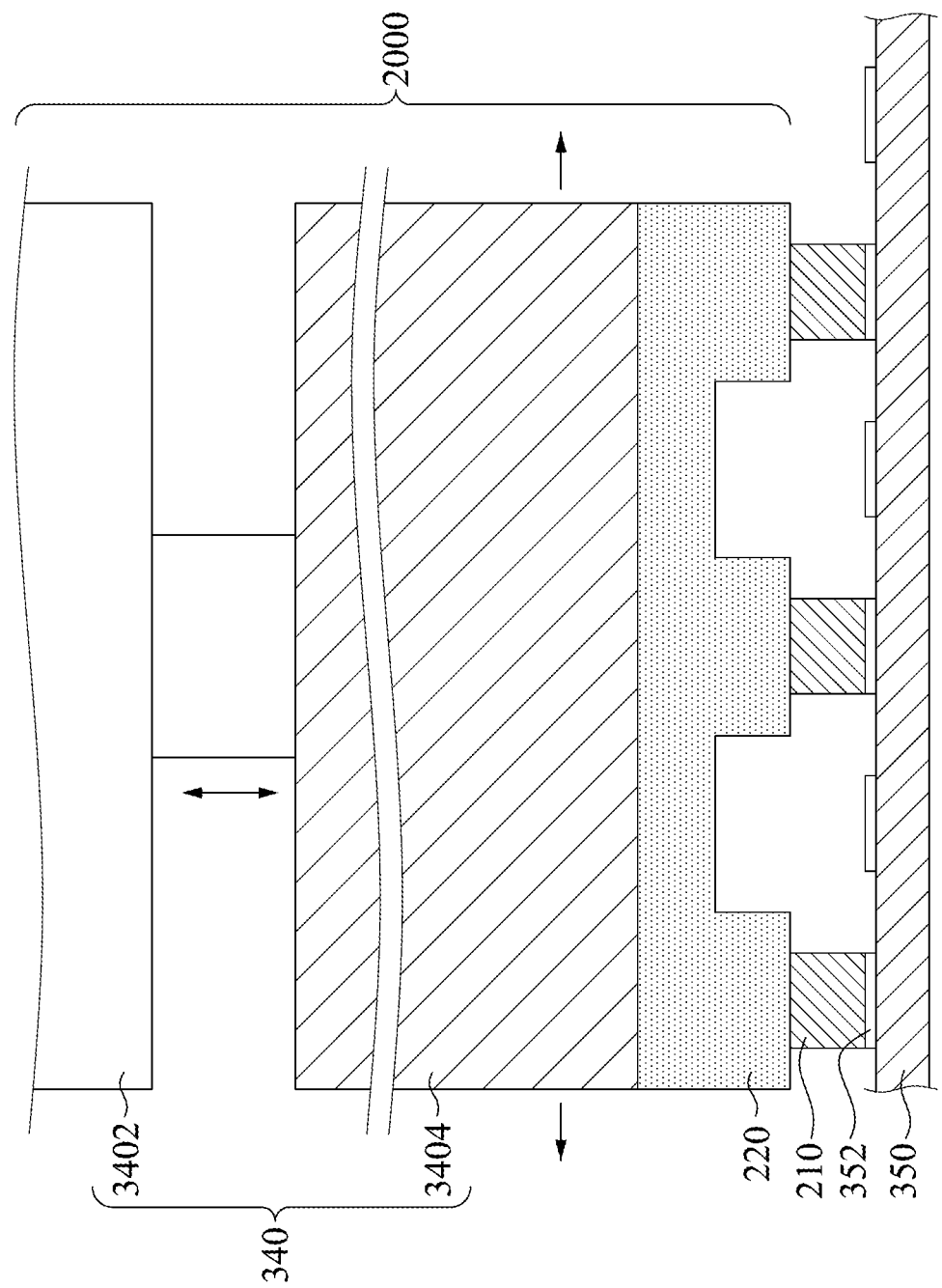
FIG. 2F is a schematic cross-sectional view of an intermediate stage of the method of transferring the micro devices according to some embodiments of the present disclosure.
Figure 2G:
FIG. 2G is a schematic cross-sectional view of an intermediate stage of the method of transferring the micro devices according to some embodiments of the present disclosure.

Reference is made to FIGS. 1 to 2G. FIG. 1 is a schematic flow chart of a method 100 of transferring the micro devices 210 according to some embodiments of the present disclosure. FIGS. 2A to 2G are schematic cross-sectional views of intermediate stages of the method 100 of transferring the micro devices 210 according to some embodiments of the present disclosure. The method 100 begins with operation 110 in which a detachable transfer plate 220 is aligned to a carrier substrate 230 with micro devices 210 thereon by an alignment assistive mechanism 240 which is detachably assembled with the detachable transfer plate 220 (as referred to FIG. 2A). The method 100 continues with operation 120 in which the detachable transfer plate 220 is in contact with the micro devices 210 on the carrier substrate 230 by the alignment assistive mechanism 240 (as referred to FIG. 2B).

The method 100 continues with operation 130 in which the micro devices 210 are picked up from the carrier substrate 230 by the detachable transfer plate 220 (as referred to FIG. 2C). The method 100 continues with operation 140 in which the detachable transfer plate 220 with the micro devices 210 thereon is detached from the alignment assistive mechanism 240 (as referred to FIG. 2D). The method 100 continues with operation 150 in which the detachable transfer plate 220 with the micro devices 210 thereon is moved to be assembled to another alignment assistive mechanism 340 above a receiving substrate 350 to form a device transfer assembly 2000, and the micro devices 210 face the receiving substrate 350 (as referred to FIG. 2E). The method 100 continues with operation 160 in which the micro devices 210 on the detachable transfer plate 220 are aligned with the receiving substrate 350 by the another alignment assistive mechanism 340 which controls a position of the detachable transfer plate 220 (as referred to FIGS. 2E and 2F). The method 100 continues with operation 170 in which the micro devices 210 are transferred to the receiving substrate 350 by the another alignment assistive mechanism 340 through the detachable transfer plate 220 (as referred to FIG. 2F), and then the micro devices 210 are released from the detachable transfer plate 220 (as referred to FIG. 2G). In operation 150, since there is only the detachable transfer plate 220 with the micro devices 210 thereon is moved or conveyed to be aligned with the receiving substrate 350, a throughput of transferring the micro devices 210 is enhanced because the detachable transfer plate 220 is smaller, lighter, and simpler in structure compared to the alignment assistive mechanism 240. Furthermore, there may be a plurality of different detachable transfer plates each with one type of micro devices thereon prepared for operations 150, 160, and 170, such that times for waiting the operations 110, 120, 130, and 140 to be completed can be omitted in some embodiments to increase efficiency and flexibility of operations.

Figure 3A:
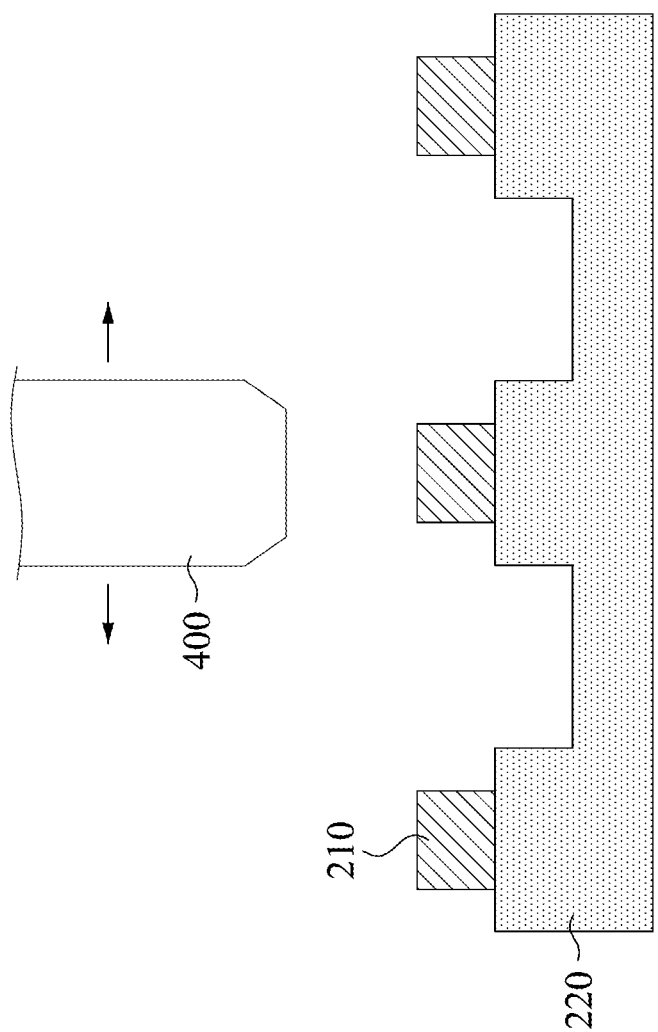
FIG. 3A is a schematic cross-sectional view of an optional stage of the method of transferring micro devices according to some embodiments of the present disclosure.
Figure 3B:
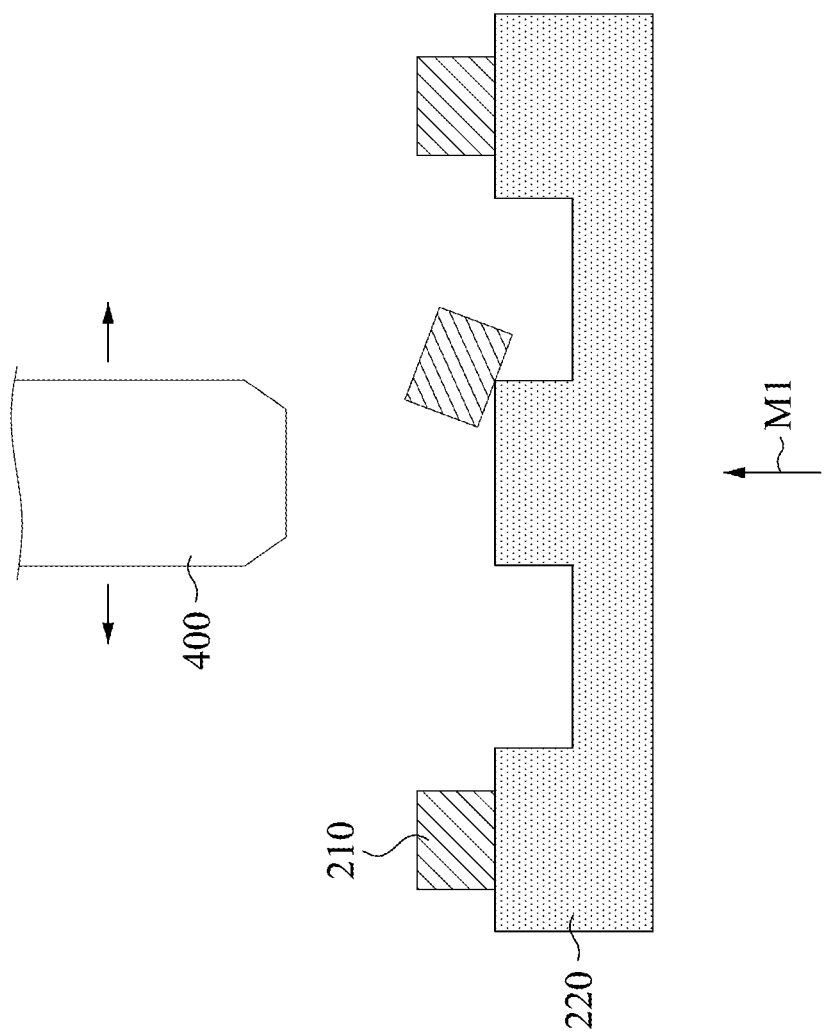
FIG. 3B is a schematic cross-sectional view of an optional stage of the method of transferring micro devices according to some embodiments of the present disclosure.
Figure 3C:
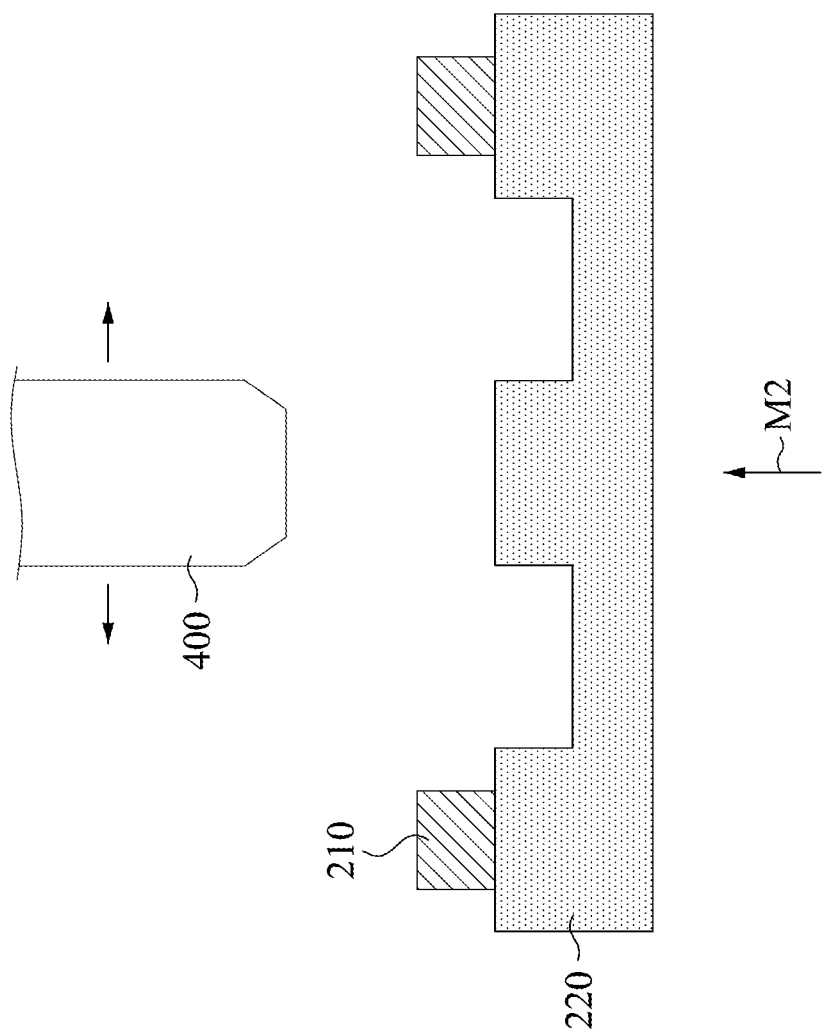
FIG. 3C is a schematic cross-sectional view of an optional stage of the method of transferring micro devices according to some embodiments of the present disclosure.

Reference is made to FIGS. 3A to 3C. FIGS. 3A to 3C are schematic cross-sectional views of optional stages of the method 100 of transferring the micro devices 210 according to some embodiments of the present disclosure. In some embodiments, after picking up the micro devices 210 from the carrier substrate 230, the detachable transfer plate 220 is inspected. The inspection may include marking a misplace M1 (see FIG. 3B) or an absence M2 (see FIG. 3C) of at least one micro device 210 on the detachable transfer plate 220 to enhance quality control. In some embodiments, the detachable transfer plate 220 is inspected after the detachable transfer plate 220 with the micro devices 210 thereon is detached from the alignment assistive mechanism 240. An inspection device 400 used for said inspection may be an optical microscope, but should not be limited thereto. It is noted that normally the micro devices 210 from the same carrier substrate 230 are the same type (e.g., they are all blue micro light-emitting diodes, but should not be limited thereto) because the micro devices 210 as mentioned come from the same epitaxial layer grown from a growth substrate, and then the growth substrate is removed by, e.g., laser lift-off (LLO).

Figure 4:
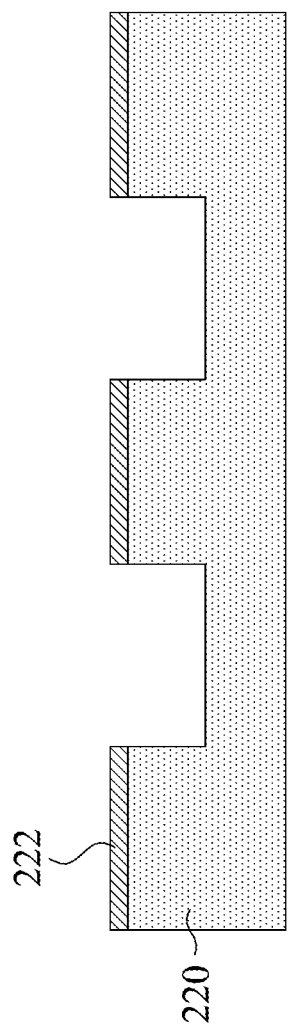
FIG. 4 is a schematic cross-sectional view of the detachable transfer plate according to some embodiments of the present disclosure.

Reference is made to FIG. 4. FIG. 4 is a schematic cross-sectional view of the detachable transfer plate 220 according to some embodiments of the present disclosure. In some embodiments, the detachable transfer plate 220 is made of fused silica or glass with a glue layer 222 thereon configured to grip the micro devices 210. In some embodiments, the glue layer 222 is an ultraviolet (UV) curable glue layer or an UV release glue layer, but should not be limited thereto. An adhesive force applied to the micro devices 210 by the glue layer 222 can be reduced after the glue layer 222 is irradiated by UV light. Therefore, in the above embodiments, the micro devices 210 may be picked up by the detachable transfer plate 220 through the adhesive force exerted by the detachable transfer plate 220, and then the adhesive force between the detachable transfer plate 220 and the micro devices 210 are reduced before the micro devices 210 are transferred to the receiving substrate 350.

Figure 5A:
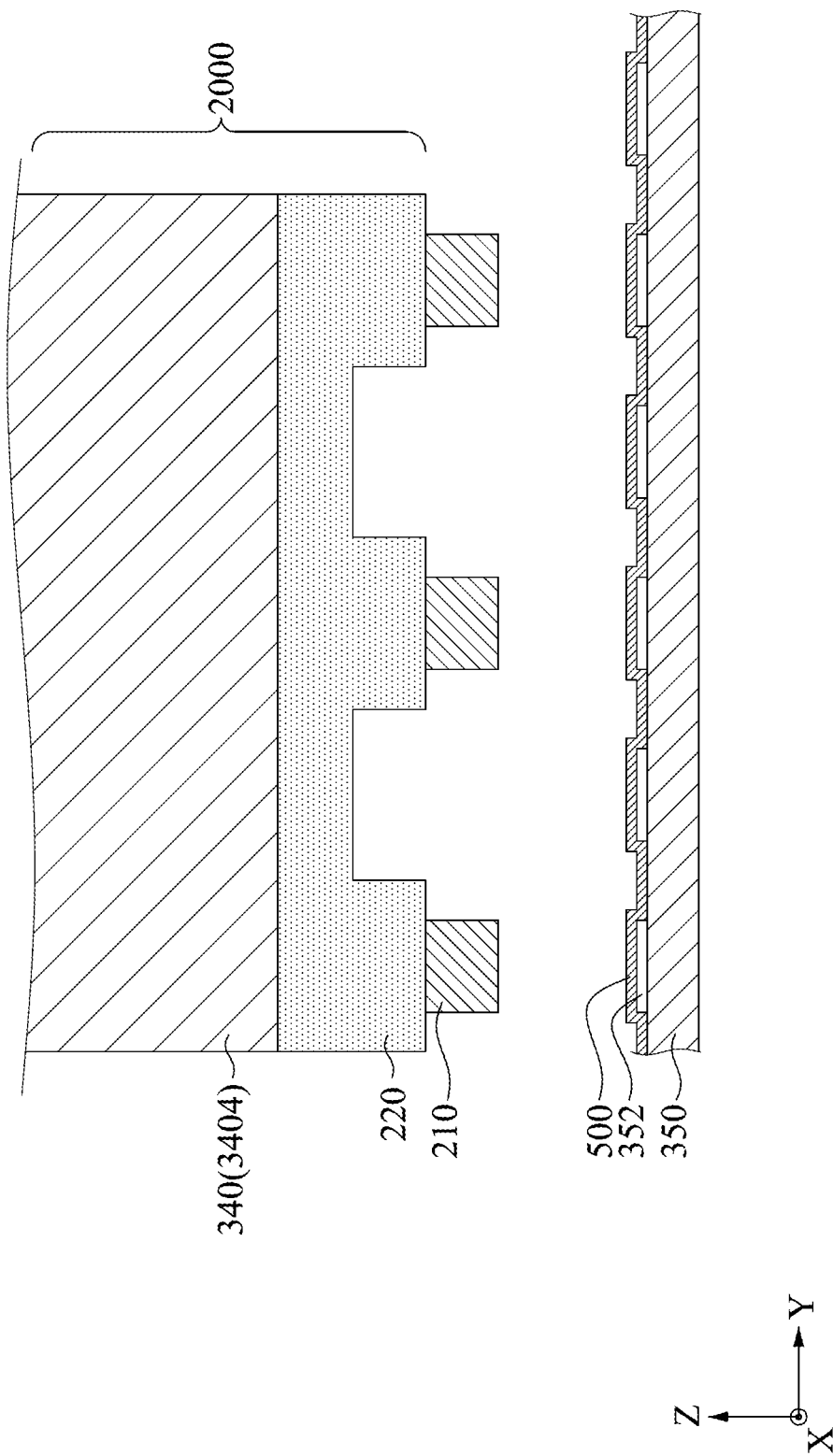
FIG. 5A is a schematic cross-sectional view of an optional stage of the method of transferring micro devices according to some embodiments of the present disclosure.
Figure 5B:
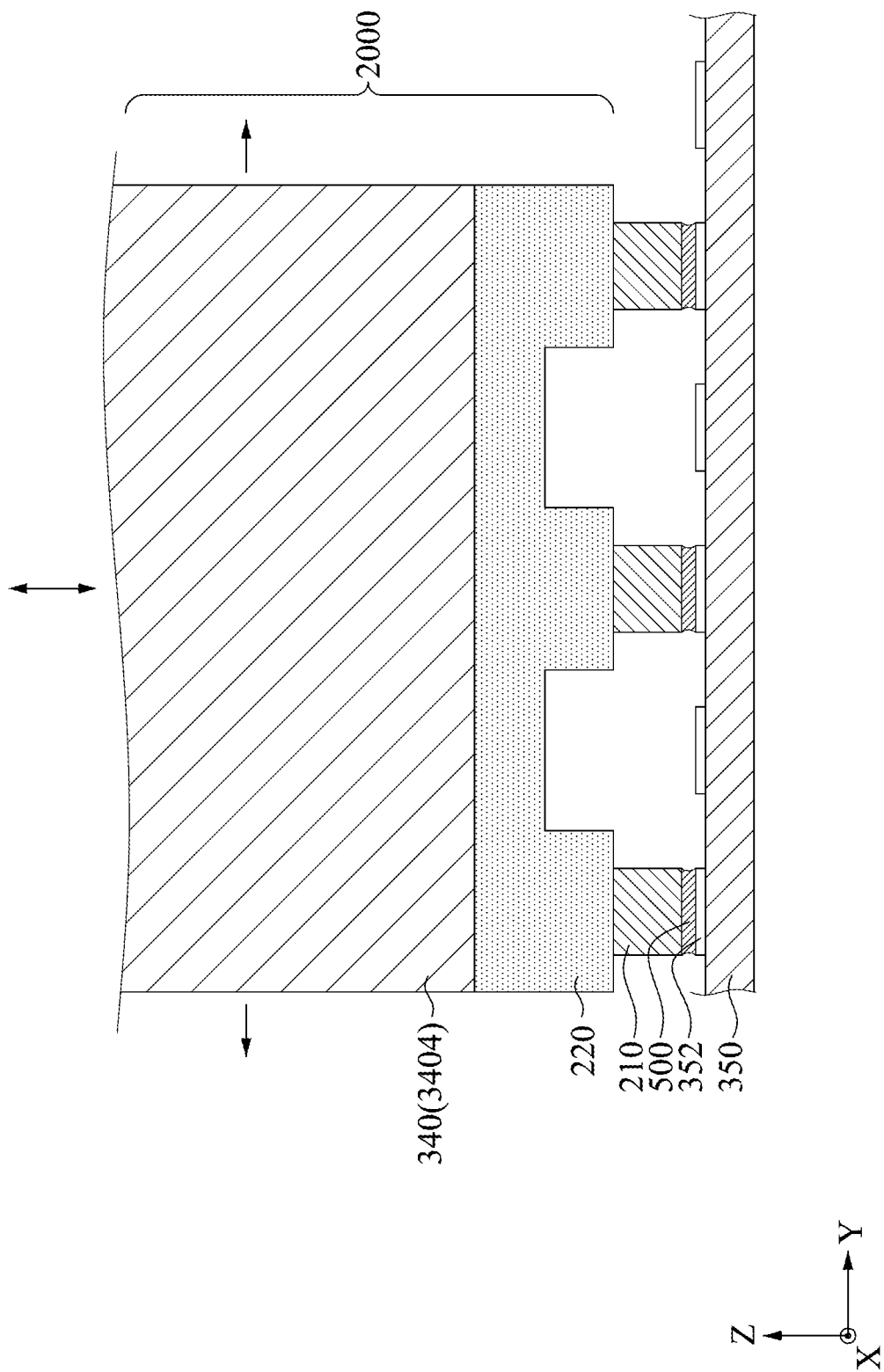
FIG. 5B is a schematic cross-sectional view of an optional stage of the method of transferring micro devices according to some embodiments of the present disclosure.

Reference is made to FIGS. 5A and 5B. FIGS. 5A and 5B are schematic cross-sectional views of optional stages of the method 100 of transferring the micro devices 210 according to some embodiments of the present disclosure. In some embodiments, liquid 500 is formed between the micro devices 210 and the receiving substrate 350 during transferring the micro devices 210 to the receiving substrate 350, such that the micro devices 210 and the contact pads 352 on the receiving substrate 350 are respectively gripped together by the capillary force produced by two opposite surfaces of the liquid 500 when the micro devices 210 are placed in proximity to the contact pads 352. The liquid 500 can be formed on surfaces of the contact pads 352 facing the micro devices 210 or on surfaces of the micro devices 210 facing the contact pads 352. The liquid 500 can also be formed on both of the surfaces of the micro devices 210 and the surfaces of the contact pads 352 as mentioned. In some embodiments, the capillary force is greater than the adhesive force before the adhesive force is reduced. In some embodiments, the capillary force is greater than the adhesive force after the adhesive force is reduced. In some embodiments, a temperature of the receiving substrate 350 is lowered such that the liquid 500 is frozen before the micro devices 210 are released from the detachable transfer plate 220. Specifically, the frozen liquid 500 provides a force to grip the micro devices 210, and the micro devices 210 are then released from the detachable transfer plate 220. In some embodiments, the force provided by the frozen liquid 500 is greater than the adhesive force before the adhesive force is reduced. In some embodiments, the force provided by the frozen liquid 500 is greater than the adhesive force after the adhesive force is reduced.

After the micro devices 210 and the contact pads 352 are gripped together by the capillary force, the liquid 500 is evaporated such that at least one of the micro devices 210 is stuck and bound to the contact pads 352 of the receiving substrate 350 (back to see FIG. 2F). In some embodiments, a binding force which binds the micro devices 210 to the contact pads 352 is greater than the adhesive force before the adhesive force is reduced. In some embodiments, the binding force which binds the micro devices 210 to the contact pads 352 is greater than the adhesive force after the adhesive force is reduced.

Figure 6:
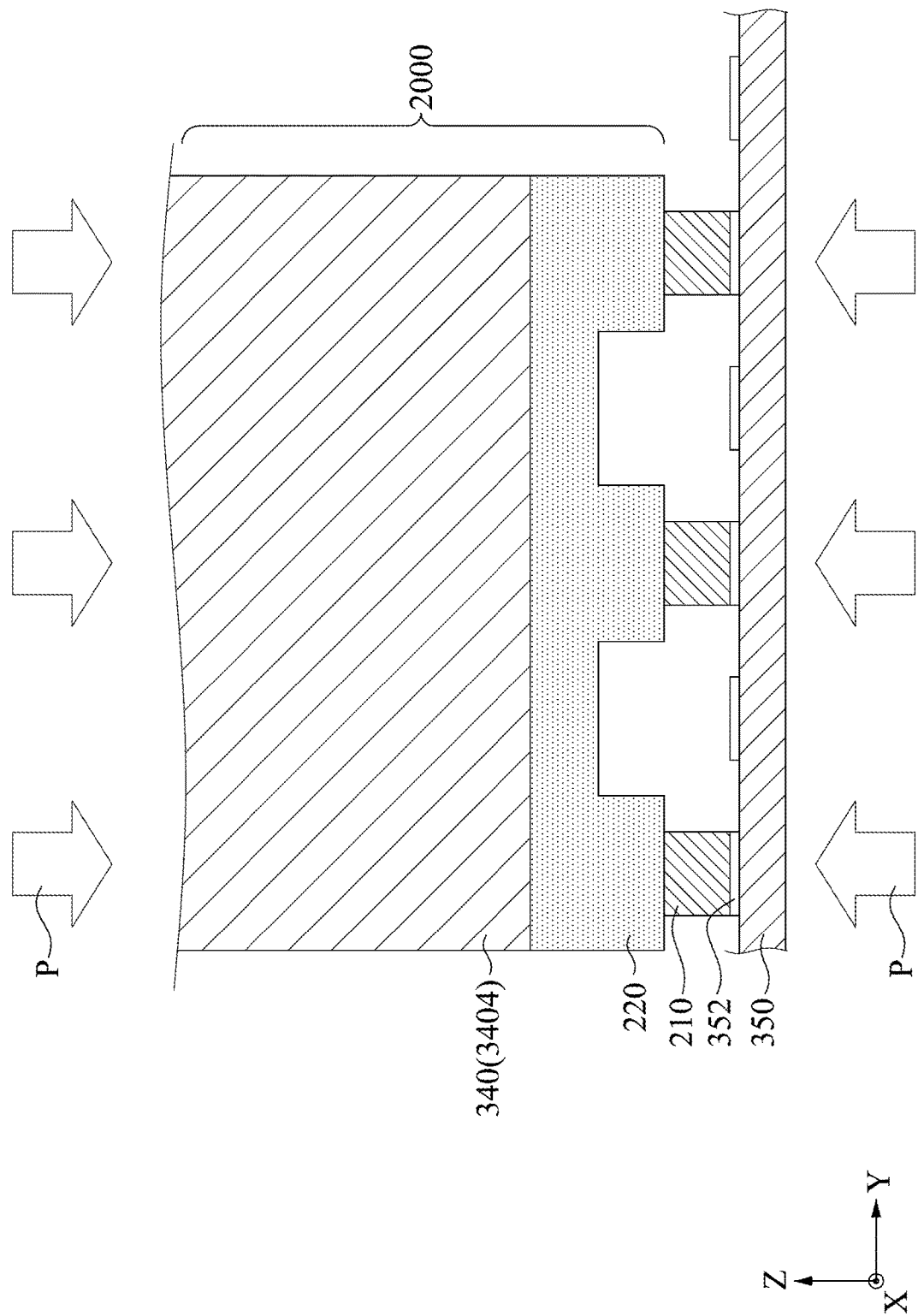
FIG. 6 is a schematic cross-sectional view of an optional stage of the method of transferring micro devices according to some embodiments of the present disclosure.

Reference is made to FIG. 6. FIG. 6 is a schematic cross-sectional view of an optional stage of the method 100 of transferring the micro devices 210 according to some embodiments of the present disclosure. In some embodiments, an external pressure P is applied to press the micro devices 210 and the receiving substrate 350 during evaporating the liquid 500 to further assist contacting the micro devices 210 to the contact pads 352 such that a better solid phase bonding therebetween can occur. The external pressure P can be applied by the another alignment assistive mechanism 340 of the device transfer assembly 2000 to the micro devices 210 or changing the environmental pressure to press the micro devices 210 and the contact pads 352, but should not be limited thereto.

Figure 7:
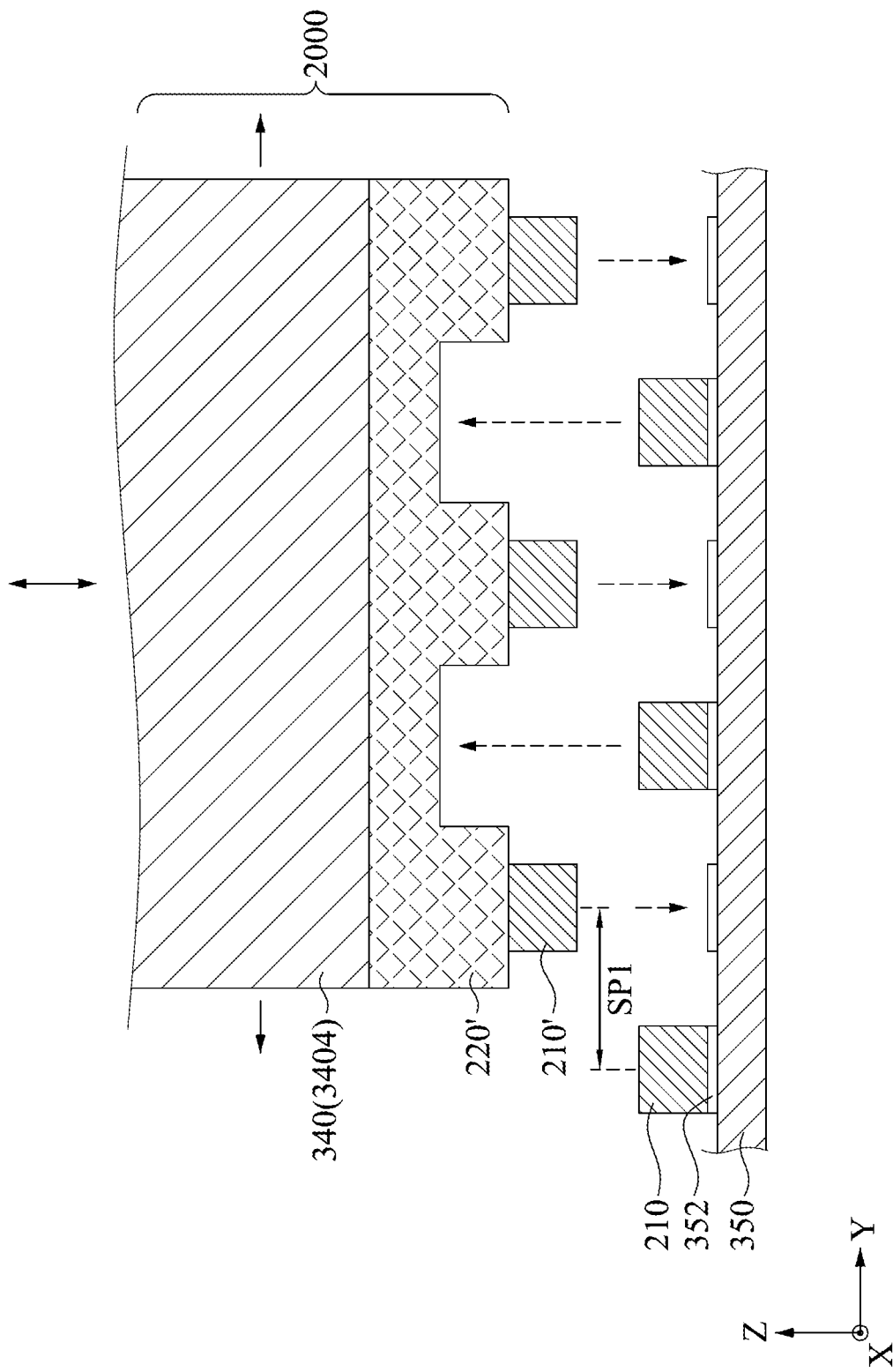
FIG. 7 is a schematic cross-sectional view of an optional stage of the method of transferring micro devices according to some embodiments of the present disclosure.

Reference is made to FIG. 7. FIG. 7 is a schematic cross-sectional view of an optional stage of the method 100 of transferring the micro devices 210 according to some embodiments of the present disclosure. In some embodiments, micro devices 210' of another type are transferred to the receiving substrate 350 via another detachable transfer plate 220' with the micro devices 210' of the another type thereon assembled to the another alignment assistive mechanism 340. As such, the another alignment assistive mechanism 340 only needs to be moved by a distance substantially equal to one pitch SP1 of sub-pixels arranged in a lateral direction (e.g., in y-axis) during operations of transferring different types of micro devices 210 and 210' to the contact pads 352 of the receiving substrate 350, so as to save time for moving and aligning the another alignment assistive mechanism 340 with the receiving substrate 350.

Figure 8A:
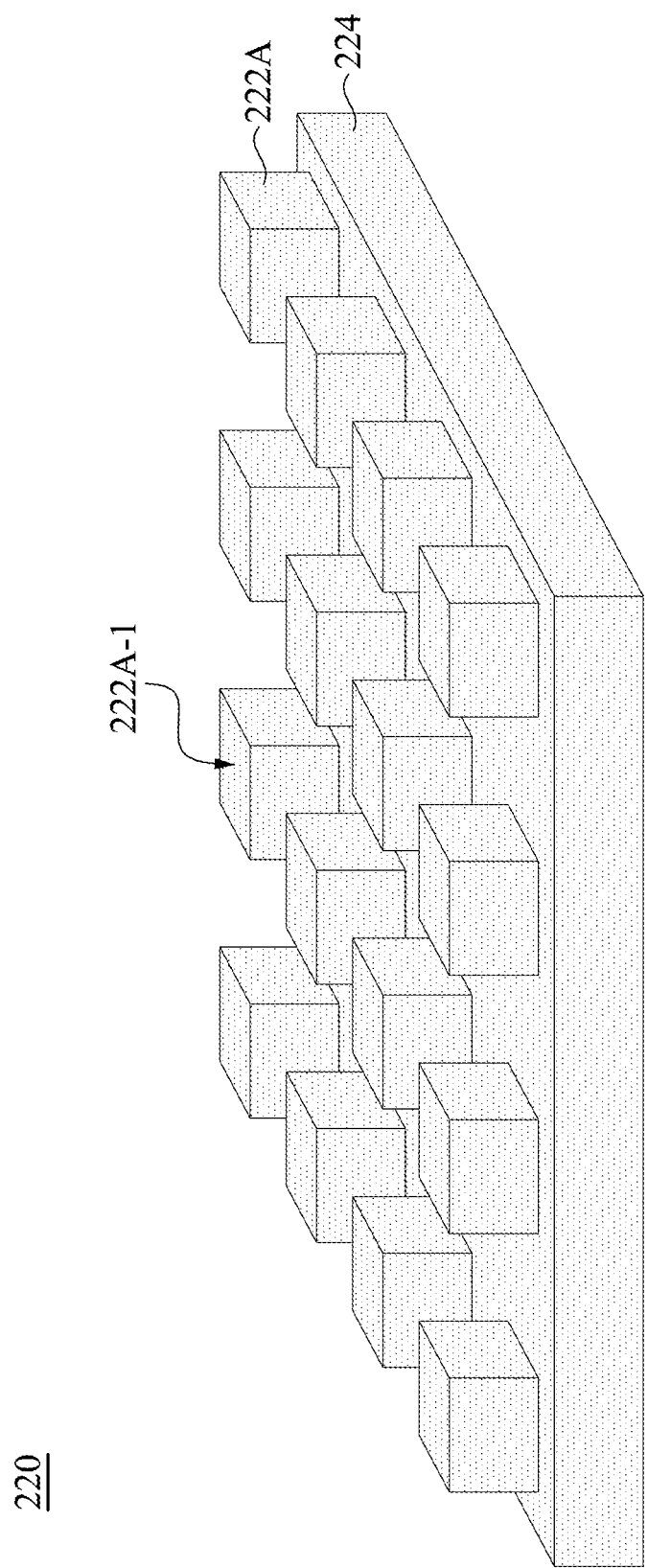
FIG. 8A is a schematic view of one type of the detachable transfer plate according to some embodiments of the present disclosure.
Figure 8B:
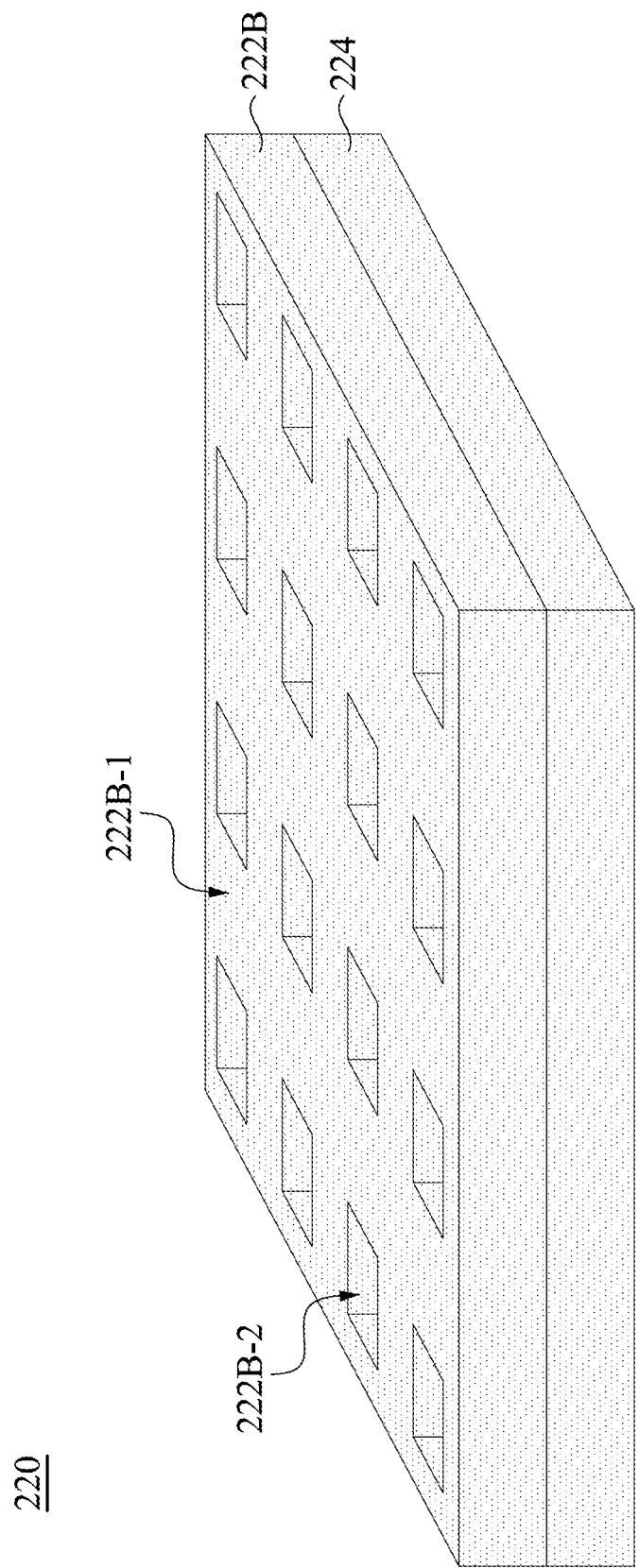
FIG. 8B is a schematic view of one type of the detachable transfer plate according to some embodiments of the present disclosure.
Figure 9:
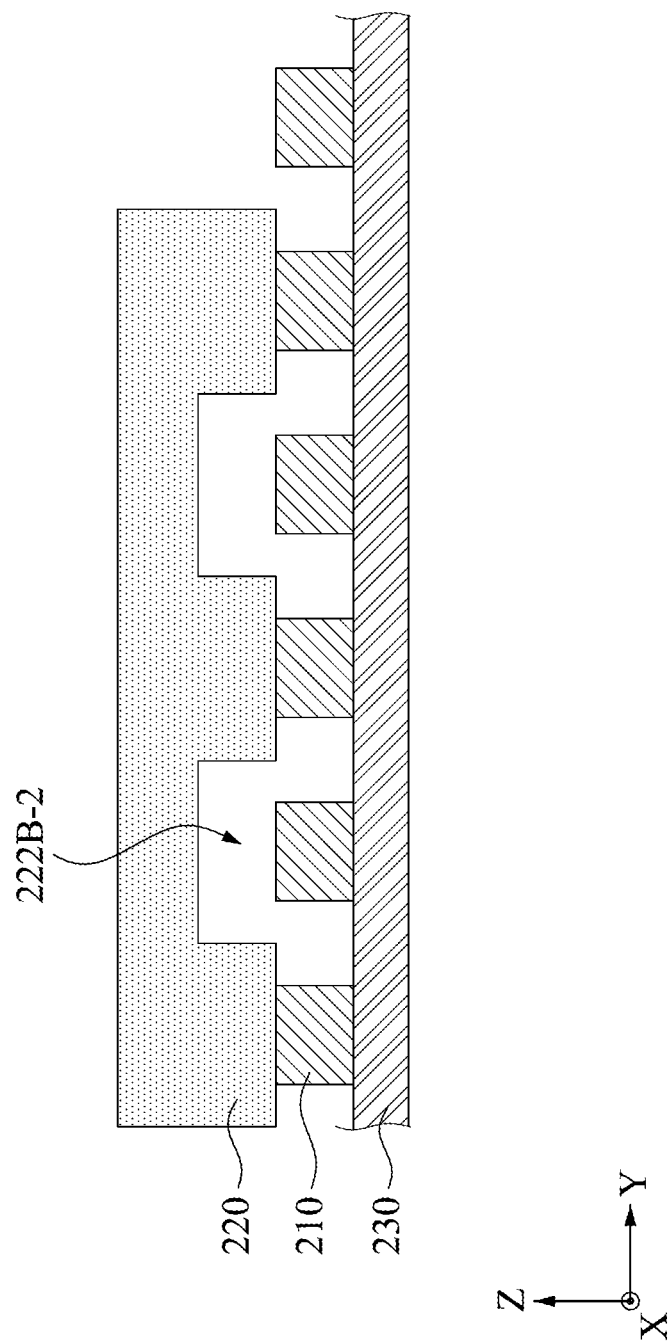
FIG. 9 is a schematic cross-sectional view which illustrates picking up the micro devices by the detachable transfer plate according to some embodiments of the present disclosure.

Reference is made to FIGS. 7 to 9. FIG. 8A is a schematic view of one type of the detachable transfer plate 220 according to some embodiments of the present disclosure. FIG. 8B is a schematic view of one type of the detachable transfer plate 220 according to some embodiments of the present disclosure. FIG. 9 is a schematic cross-sectional view which illustrates picking up the micro devices 210 by the detachable transfer plate 220 according to some embodiments of the present disclosure. In some embodiments, the detachable transfer plate 220 includes a picked-up portion 222A (or a picked-up portion 222B) and a base portion 224. The picked-up portion 222A(222B) has a surface 222A-1 (or a surface 222B-1) configured to pick up the micro devices 210. The base portion 224 is connected with the picked-up portion 222A(222B) and opposite to the surface 222A-1 (222B-1) of the picked-up portion 222A(222B). In some embodiments, a Young's module of the picked-up portion 222A(222B) is smaller than a Young's module of the base portion 224. As such, since the picked-up portion 222A (222B) deforms when the detachable transfer plate 220 contacts the micro devices 210, the micro devices 210 are leveled with the detachable transfer plate 220. In this way, each of the micro devices 210 intended to be picked up can be in contact with the detachable transfer plate 220 to maintain a presence of grip forces exerted on each of the micro devices 210 intended to be picked. In other words, when the detachable transfer plate 220 contacts the micro devices 210, a total volume of gaps or a number of the gaps between the detachable transfer plate 220 and each of the micro devices 210 intended to be picked up can be decreased. Therefore, it makes the detachable transfer plate 220 avoid failing in picking up the micro devices 210, and increases the successful rate of picking up. Furthermore, the condition on the Young's module as mentioned avoids damages on the micro devices 210 when the micro devices 210 are picked up by the picked-up portion 222A(222B) of the detachable transfer plate 220. A difference between the embodiments illustrated by FIG. 8A and the embodiments illustrated by FIG. 8B is a geometric structure of the picked-up portion 222A(222B) of the detachable transfer plate 220. The picked-up portion 222A as shown in FIG. 8A includes a plurality of isolated and island-like portions each having the surface 222A-1 for picking up the micro devices 210. Devices or elements not intended to be picked up by the picked-up portion 222A can be accommodated in place without the picked-up portion 222A which faces the base portion 224 when the micro devices 210 are picked up via the surface(s) 222A-1. The picked-up portion 222B as shown in FIG. 8B includes at least one recess 222B-2 configured to accommodate devices or elements not intended to be picked up by the picked-up portion 222B. In some embodiments, the recess(es) 222B-2 is(are) configured to accommodate at least one micro device 210 on the carrier substrate not to be picked up (see FIG. 9). The recess(es) 222B-2 can also be used to accommodate objects which are already existed on the receiving substrate 350. A function of the accommodation as mentioned is also applicable to the embodiments as illustrated by FIG. 8A. There is a continuous surface 222B-1 on the picked-up portion 222B for picking up the micro devices 210. In some embodiments, the recess(es) 222B-2 is(are) fully enclosed by the continuous surface 222B-1 at a plane of the picked-up portion 222B opposite to the base portion 224. In some embodiments, the glue layer 222 as illustrated in FIG. 4 may be formed on the surface 222A-1(222B-1) of the picked-up portion 222A (222B) (not shown in FIGS. 8A and 8B). Briefly, the micro devices 210 can be selectively picked up by the detachable transfer plate 220 as illustrated by FIGS. 8A and 8B.

Reference is made back to FIGS. 2A, 2E, 2G, and 7. The above embodiments as illustrated in the present disclosure can be performed by the device transfer assembly 2000 in which structural features thereof are described as follows. In some embodiments, the device transfer assembly 2000 includes the alignment assistive mechanism 240 and the detachable transfer plate 220. The alignment assistive mechanism 240 has a first portion 2402 fixed at a place and a second portion 2404 which is movable at least in one axis. Specifically, the alignment assistive mechanism 240 can be set up in a production line. In some embodiments, the first portion 2402 can be fixed on a certain place in the production line, but should not be limited thereto. The second portion 2404 has degrees of freedom in at least z-axis as shown in the figures. The second portion 2404 can have degrees of freedom in x-axis and y-axis for aligning. The detachable transfer plate 220 can be detachably assembled on the second portion 2404 of the alignment assistive mechanism 240. The detachable transfer plate 220 is configured to pick up the micro devices 210 from the carrier substrate 230 by the alignment assistive mechanism 240 or to place the micro devices 210 on the receiving substrate 350 by the another alignment assistive mechanism 340. In some embodiments, the detachable transfer plate 220 includes at least one recess 220B-2 thereon, and the recess 220B-2 is configured to accommodate another micro device on the carrier substrate 230 not to be picked up. In some embodiments, some align marks are on the detachable transfer plate 220 to assist aligning in operations which have been mentioned above.

In some embodiments, the device transfer assembly 2000 further includes another alignment assistive mechanism 340 configured to detachably assemble the detachable transfer plate 220 thereon. The another alignment assistive mechanism 340 has a first portion 3402 fixed at a place and a second portion 3404 which is movable at least in one axis which is similar to the alignment assistive mechanism 240 and details will not be repeated again. With the above configuration, the alignment assistive mechanism 240 and the another alignment assistive mechanism 340 can be substantially fixed at places as mentioned and only the detachable transfer plate 220 (which is much smaller, lighter, and simpler in structure) is moved or transferred (e.g., along the production line, but should not be limited thereto) from the alignment assistive mechanism 240 to the another alignment assistive mechanism 340 through a conveyor 2002 for example, but should not be limited thereto. As such, the throughput can be enhanced. Besides, since different detachable transfer plates (e.g., the detachable transfer plate 220 and the detachable transfer plate 220') which carry different types of micro devices (e.g., micro light-emitting diodes of different wavelengths, but should not be limited thereto) can be assembled on the another alignment assistive mechanism 340 one after another, the another alignment assistive mechanism 340 only needs to be moved by one pitch SP1 of sub-pixels during operations of transferring different types of micro devices to the contact pads 352 of the receiving substrate 350, so as to save time for moving and aligning the another alignment assistive mechanism 340 to the receiving substrate 350.

It is noted that in the above embodiments a number of the detachable transfer plates (e.g., the detachable transfer plates 220, 220' . . . etc.) can be different from a number of the alignment assistive mechanisms (the alignment assistive mechanisms 240, 340). For example, when there are three or more types of micro devices (e.g., the red micro light-emitting diodes, green micro light-emitting diodes, and blue micro light-emitting diodes . . . etc.), there can be corresponding three or more detachable transfer plates included in the device transfer assembly 2000, so as to enhancing the throughput of transferring micro devices. Furthermore, times for waiting the operations 110, 120, 130, and 140 to be completed can be omitted in some embodiments as mentioned to increase efficiency and flexibility of operations.

In summary, embodiments of the present disclosure provide a method of transferring a micro device and a device transfer assembly in which only a detachable transfer plate which is small, light, and simple in structure is moved from a carrier substrate to a receiving substrate. As such, a throughput of transferring micro devices is enhanced and time for alignment is reduced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the method and the structure of the present disclosure without departing from the scope or spirit of the disclosure. In view of the foregoing, it is intended that the present disclosure cover modifications and variations of this disclosure provided they fall within the scope of the following claims.

What is claimed is:
1. A method of transferring micro devices, comprising:
aligning a detachable transfer plate to a carrier substrate with micro devices thereon by an alignment assistive mechanism which is detachably assembled with the detachable transfer plate;
contacting the detachable transfer plate to the micro devices on the carrier substrate by the alignment assistive mechanism;
picking up the micro devices from the carrier substrate by the detachable transfer plate;
detaching the detachable transfer plate with the micro devices thereon from the alignment assistive mechanism;
moving the detachable transfer plate with the micro devices thereon to be assembled to another alignment assistive mechanism above a receiving substrate to form a device transfer assembly, wherein the micro devices face the receiving substrate;
aligning the micro devices on the detachable transfer plate with the receiving substrate; and
transferring the micro devices to the receiving substrate by the another alignment assistive mechanism through the detachable transfer plate.

2. The method of claim 1, further comprising:
inspecting the detachable transfer plate after picking up the micro devices from the carrier substrate.

3. The method of claim 2, further comprising:
marking a misplace or an absence of one micro device on the detachable transfer plate.

4. The method of claim 2, wherein the detachable transfer plate is inspected after detaching the detachable transfer plate with the micro devices thereon from the alignment assistive mechanism.

5. The method of claim 1, wherein the detachable transfer plate is made of fused silica or glass with a glue layer thereon configured to grip the micro devices.

6. The method of claim 1, wherein the micro devices are picked up by the detachable transfer plate through an adhesive force exerted by the detachable transfer plate.

7. The method of claim 6, further comprising:
reducing the adhesive force between the detachable transfer plate and the micro devices before transferring the micro devices to the receiving substrate.

8. The method of claim 1, further comprising:
forming liquid between the micro devices and the receiving substrate during transferring the micro devices to the receiving substrate, such that at least one of the micro devices is gripped by a capillary force produced by the liquid.

9. The method of claim 8, further comprising:
evaporating the liquid such that at least one of the micro devices is stuck and bound to the receiving substrate.

10. The method of claim 9, further comprising:
applying an external pressure to press the micro devices and the receiving substrate during evaporating the liquid.

11. The method of claim 8, further comprising:
lowering a temperature of the receiving substrate such that the liquid is frozen.

12. The method of claim 1, further comprising:
transferring micro devices of another type to the receiving substrate via assembling another detachable transfer plate with the micro devices of the another type thereon to the another alignment assistive mechanism.

13. The method of claim 1, wherein the detachable transfer plate comprises:
a picked-up portion having a surface configured to pick up the micro devices; and
a base portion connected with the picked-up portion and opposite to the surface of the picked-up portion, wherein a Young's module of the picked-up portion is smaller than a Young's module of the base portion.

14. The method of claim 1, wherein the detachable transfer plate comprises at least one recess thereon, and the at least one recess is configured to accommodate at least one micro device on the carrier substrate not to be picked up.

* * * * *